(12) United States Patent
Otsuka et al.

(10) Patent No.: US 10,833,045 B2
(45) Date of Patent: Nov. 10, 2020

(54) SUBSTRATE PROCESSING APPARATUS AND MANUFACTURING METHOD OF SUBSTRATE HOLDING UNIT (71) Applicant: Tokyo Electron Limited, Tokyo (JP)

(72) Inventors: Yoshitaka Otsuka, Koshi (JP); Munehisa Kodama, Koshi (JP); Takashi Terada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 349 days.

(21) Appl. No.: 15/989,633

(22) Filed: May 25, 2018

(65) Prior Publication Data

US 2018/0342479 A1    Nov. 29, 2018

(30) Foreign Application Priority Data

May 26, 2017   (JP) .................................. 2017-104741

(51) Int. Cl.
*H01L 21/67* (2006.01)
*H01L 21/68* (2006.01)
*H01L 23/00* (2006.01)
*H01L 21/683* (2006.01)

(52) U.S. Cl.
CPC ........ *H01L 24/75* (2013.01); *H01L 21/67115* (2013.01); *H01L 21/6831* (2013.01); *H01L 21/6833* (2013.01); *H01L 24/83* (2013.01); *H01L 24/94* (2013.01); *H01L 2224/75251* (2013.01); *H01L 2224/75611* (2013.01); *H01L 2224/75981* (2013.01); *H01L 2224/83005* (2013.01); *H01L 2224/8322* (2013.01)

(58) Field of Classification Search
CPC . H01L 2224/75251; H01L 2224/75981; H01L 2224/8322; H01L 21/6833; H01L 21/67115
See application file for complete search history.

(56) References Cited

U.S. PATENT DOCUMENTS

| 2015/0059985 | A1* | 3/2015 | Matsunaga | ....... | H01L 21/67109 156/499 |
| 2016/0358803 | A1* | 12/2016 | Lee | ................... | H01L 21/67336 |
| 2017/0316963 | A1* | 11/2017 | Parkhe | ................ | H01L 21/6831 |

FOREIGN PATENT DOCUMENTS

JP   2015-149433 A   8/2015

* cited by examiner

*Primary Examiner* — Robert B Davis
(74) *Attorney, Agent, or Firm* — Pearne & Gordon LLP (57) ABSTRACT

A substrate processing apparatus 30 includes a first holding unit 200 configured to hold a processing target substrate W; a second holding unit 300 disposed to face the first holding unit 200 and configured to hold a support substrate S; and an ultraviolet irradiation unit 400 configured to irradiate an ultraviolet ray to an adhesive G provided between the processing target substrate W and the support substrate S. Each of the support substrate S and the second holding unit 300 is made of an ultraviolet transmissive material. An electrode 320 configured to electrostatically attract the support substrate S is provided within the second holding unit 300. A diffusion layer 330 configured to diffuse a transmission direction of the ultraviolet ray is provided at a position closer to the support substrate S between the support substrate S and the electrode 320 within the second holding unit 300.

5 Claims, 6 Drawing Sheets

SUBSTRATE PROCESSING APPARATUS AND MANUFACTURING METHOD OF SUBSTRATE HOLDING UNIT

CROSS-REFERENCE TO RELATED APPLICATION

This application claims the benefit of Japanese Patent Application No. 2017-104741 filed on May 26, 2017, the entire disclosures of which are incorporated herein by reference.

TECHNICAL FIELD

The embodiments described herein pertain generally to a substrate processing apparatus configured to perform a preset processing on a processing target substrate and a support substrate, and a manufacturing method of a substrate holding unit configured to hold the substrate by electrostatic attraction.

BACKGROUND

Recently, in a manufacturing process of a semiconductor device, for example, a semiconductor substrate such as a silicon wafer or a compound semiconductor wafer is getting thinner while having a larger diameter. Such a thin large-diameter semiconductor substrate (hereinafter, referred to as "processing target substrate") may be bent or broken when it is transferred or polished. To suppress this problem, the processing target substrate is reinforced by connecting a support substrate to the processing target substrate.

For example, Patent Document 1 discloses bonding the processing target substrate (wafer) and the support substrate (glass plate) by using an adhesive tape. After the processing target substrate and the support substrate are bonded, adhesivity of the adhesive tape is improved by irradiating an ultraviolet ray from the support substrate side.

Patent Document 1: Japanese Patent Laid-open Publication No. 2015-149433

SUMMARY

In the method described in Patent Document 1, however, since the bonding processing of the processing target substrate and the support substrate and the ultraviolet processing from the support substrate side are performed individually, there is still a room for improvement of a throughput of a series of substrate processings. Besides, Patent Document 1 neither discloses nor mentions anything about a specific apparatus configuration for the improvement of the throughput.

In view of the foregoing, exemplary embodiments provide a technique capable of performing a substrate processing involving ultraviolet processing efficiently.

In an exemplary embodiment, a substrate processing apparatus configured to perform a preset processing on a processing target substrate and a support substrate includes a first holding unit configured to hold the processing target substrate; a second holding unit disposed to face the first holding unit and configured to hold the support substrate by electrostatically attracting the support substrate; and an ultraviolet irradiation unit configured to irradiate an ultraviolet ray to an ultraviolet curing material provided between the processing target substrate held by the first holding unit and the support substrate held by the second holding unit. Each of the support substrate and the second holding unit is made of a material through which the ultraviolet ray is transmitted. An electrode configured to electrostatically attract the support substrate is provided within the second holding unit. A diffusion layer configured to diffuse a transmission direction of the ultraviolet ray is provided at a position closer to the support substrate between the support substrate and the electrode within the second holding unit.

In the substrate processing apparatus according to the exemplary embodiment, the processing target substrate and the support substrate can be bonded to each other with the ultraviolet curing material therebetween in the state that the processing target substrate is held by the first holding unit and the support substrate is held by the second holding unit. Further, in the substrate processing apparatus, the ultraviolet ray can be irradiated to the ultraviolet curing material from the side of the second holding unit and the support substrate by the ultraviolet irradiation unit. According to the exemplary embodiment, the boding processing and the ultraviolet processing can be performed in the single apparatus, so that the throughput of the series of substrate processings can be improved.

In order to suppress void generation caused by the air introduction between the processing target substrate and the support substrate, it is desirable that the substrate processing is performed in the vacuum atmosphere. To hold the support substrate in the vacuum atmosphere, an electrode is provided in the second holding unit, and the support substrate is electrostatically attracted by the electrode. In the ultraviolet processing, though the ultraviolet ray is transmitted through the second holding unit, if there is the electrode, the distribution of the ultraviolet ray becomes non-uniform. That is, since the ultraviolet ray transmittance of the second holding unit and the ultraviolet ray transmittance of the electrode are different, the ultraviolet ray transmittance at portions where the electrode is not provided is high, whereas the ultraviolet ray transmittance at portions where the electrode is provided is low. Therefore, the ultraviolet processing cannot be performed uniformly, so that a bonding state (bonding strength or thickness) of a combined substrate obtained after being bonded may become non-uniform. Further, when the ultraviolet curing material is used in an optical application, if the ultraviolet processing is performed non-uniformly, a light transmission state of a product may be non-uniform.

Accordingly, the diffusion layer is provided at a position closer to the support substrate between the support substrate and the electrode within the second holding unit. Through the diffusion layer, the transmission direction of the ultraviolet ray is diffused, so that it is possible to allow the distribution of the ultraviolet ray, which is non-uniform due to the presence or absence of the electrode, to be uniform. According to the exemplary embodiment, the ultraviolet processing can be performed uniformly.

The diffusion layer may be formed in multiple layers at the position closer to the support substrate between the support substrate and the electrode.

The substrate processing apparatus may further include a vacuum chamber configured to accommodate therein the processing target substrate and the support substrate.

The ultraviolet irradiation unit may be provided at an outside of the vacuum chamber.

The second holding unit may be disposed such that a holding surface of the second holding unit, which holds the support substrate, is located within the vacuum chamber and a surface thereof opposite to the holding surface is exposed from the vacuum chamber.

A manufacturing method of a substrate holding unit configured to hold a substrate by electrostatically attracting the substrate includes a first process of forming irregularities on a surface of a first base body; a second process of providing an electrode on the surface of the first base body; and a third process of filling a filling material between the surface of the first base body and a surface of a second base body and bonding the first base body and the second base body.

The manufacturing method of the substrate holding unit may further include a fourth process of forming irregularities on a rear surface of the first base body after the third process.

The substrate may be a support substrate configured to support a processing target substrate with an ultraviolet curing material therebetween.

According to the exemplary embodiments as described above, it is possible to perform the substrate processing involving the ultraviolet processing efficiently.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6A and FIG. 6B show distributions of transmittance of an ultraviolet ray transmitted through the second holding unit.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described in detail with reference to the accompanying drawings. In the exemplary embodiments, as a substrate processing, a bonding processing of bonding a processing target substrate and a support substrate and an ultraviolet processing upon an adhesive as an ultraviolet curing material will be explained. Further, the following exemplary embodiments are not limiting at all.

1. Configuration of Substrate Processing System

Figure 1:
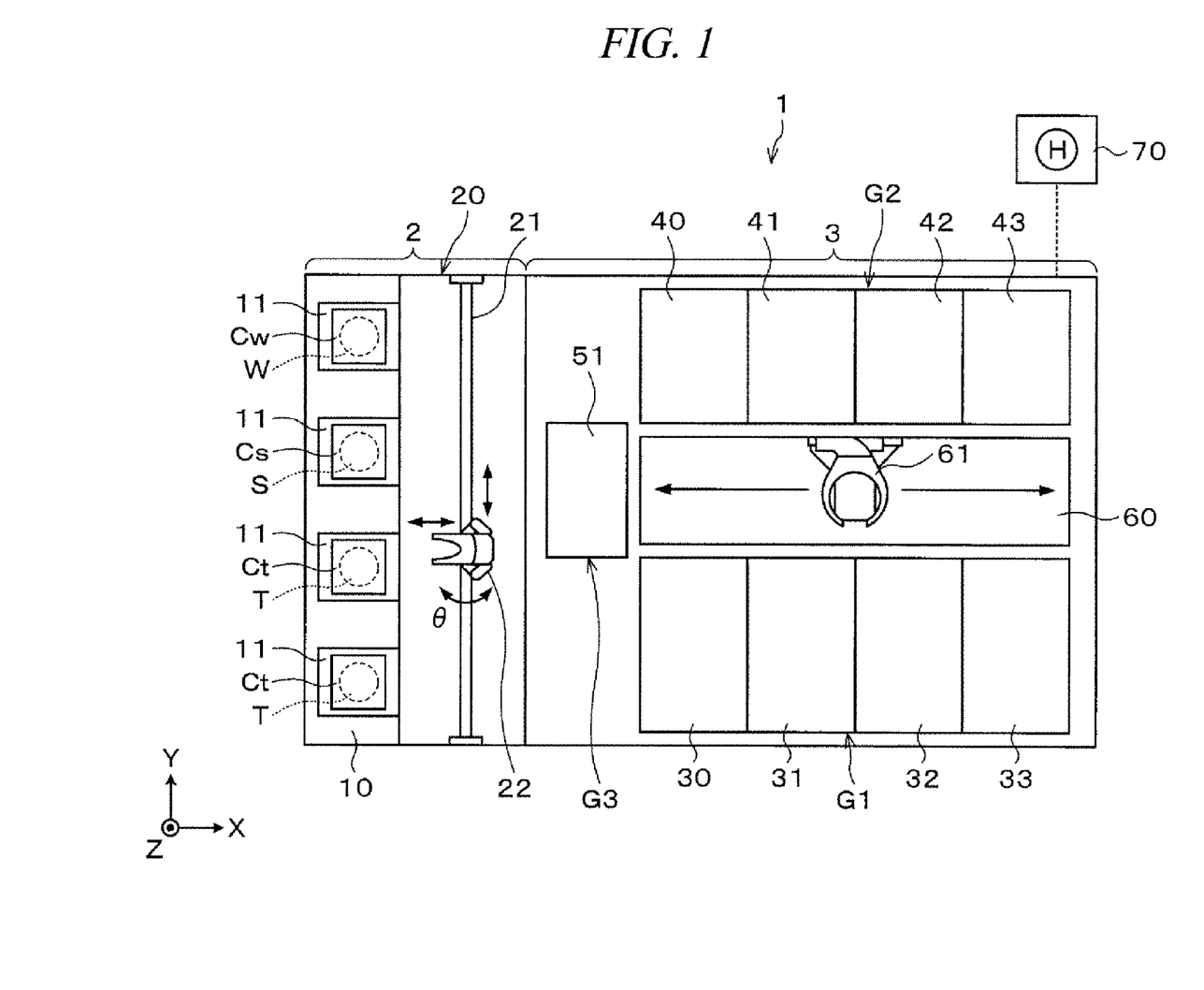
FIG. 1 is a plan view illustrating an outline of a substrate processing system equipped with a substrate processing apparatus according to an exemplary embodiment.
Figure 2:
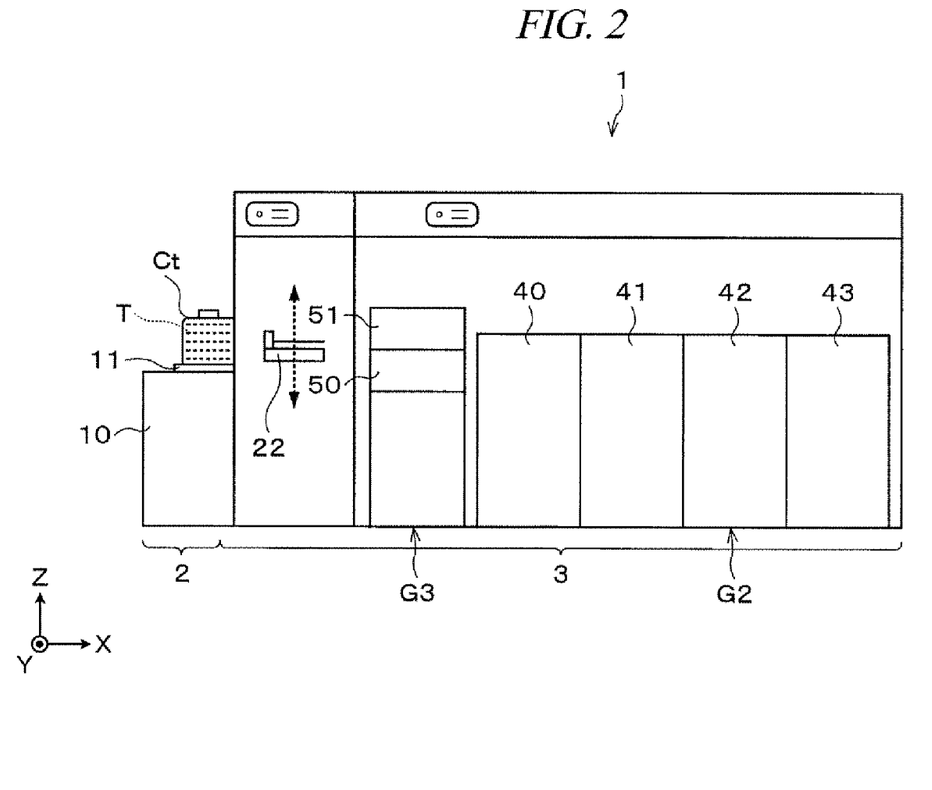
FIG. 2 is a side view illustrating a schematic internal configuration of the substrate processing system.
Figure 3:
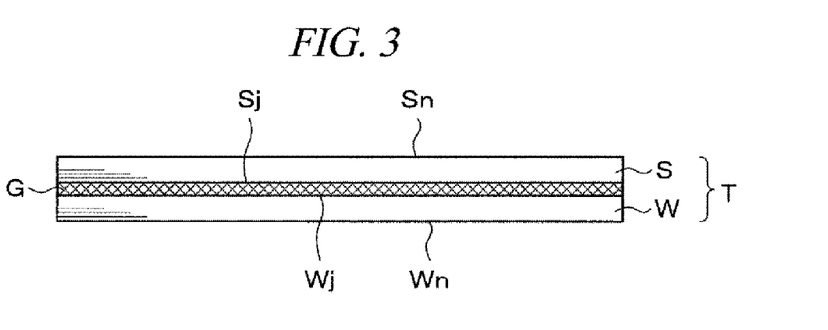
FIG. 3 is a side view illustrating a processing target substrate and a support substrate.

First, a configuration of a substrate processing system equipped with a substrate processing apparatus according to an exemplary embodiment will be explained with reference to FIG. 1 to FIG. 3. FIG. 1 is a plan view illustrating an outline of the substrate processing system. FIG. 2 is a side view illustrating a schematic internal configuration of the substrate processing system. FIG. 3 is a side view of a processing target substrate and a support substrate. In the following, in order to clarify positional relationships, the X-axis direction, Y-axis direction and Z-axis direction which are orthogonal to each other are defined, and the positive Z-axis direction is regarded as a vertically upward direction.

In the following, as illustrated in FIG. 3, among surfaces of a processing target substrate W, a surface to be bonded to a support substrate S with an adhesive G therebetween will be referred to as "bonding surface Wj," and a surface opposite to the bonding surface Wj will be referred to as "non-bonding surface Wn". Further, among surfaces of the support substrate S, a surface to be bonded to the processing target substrate W with the adhesive G therebetween will be referred to as "bonding surface Sj," and a surface opposite to the bonding surface Sj will be referred to as "non-bonding surface Sn." The processing target substrate W and the support substrate S are bonded to each other with the adhesive G therebetween, so that a combined substrate T is obtained.

The processing target substrate W is a substrate on which multiple electronic circuits (devices) are formed on a semiconductor substrate such as, but not limited to, a silicon wafer or a compound semiconductor wafer. The surface of the processing target substrate W on which the electronic circuits are formed is set to be the "bonding surface Wj." This processing target substrate W is thinned as the non-bonding surface Wn thereof is polished after the processing target substrate W is bonded to the support substrate S. Further, a glass substrate may be used as the processing target substrate W.

The support substrate S is a substrate having the substantially same diameter as the processing target substrate W, and serves to support the processing target substrate W. The support substrate S may be implemented by, for example, a glass substrate or the like. The support substrate S may not be particularly limited as long as it is made of a material through which an ultraviolet ray can be transmitted (ultraviolet transmissive material). By way of example, a quartz plate, a sapphire plate, an acryl plate may be used as the support substrate S.

The adhesive G allows the processing target substrate W and the support substrate S to be bonded by being attached to each other. Further, a material which is cured (hardened) by an ultraviolet ray, for example, an ultraviolet curing resin may be used as the adhesive G.

As illustrated in FIG. 1 and FIG. 2, the substrate processing system 1 is equipped with a carry-in/out station 2 in which cassettes Cw, Cs and Ct respectively accommodating a multiple number of processing target substrates W, a multiple number of support substrates S and a multiple number of combined substrates T are carried to/from the outside; and a processing station 3 equipped with various kinds of processing apparatuses configured to perform preset processings on the processing target substrates W, the support substrates S and the combined substrates T. The carry-in/out station 2 and the processing station 3 are connected as one body.

The carry-in/out station 2 is equipped with a cassette placing table 10. The cassette placing table 10 is provided with a plurality of, for example, four cassette placing plates 11. The cassette placing plates 11 are arranged in a row in the Y-axis direction (up-and-down direction in FIG. 1). The cassettes Cw, Cs and Ct are placed on the cassette placing plates 11 when the cassettes Cw, Cs and Ct are carried to/from the outside of the substrate processing system 1. That is, the carry-in/out station 2 is configured to be capable of holding the multiple number of processing target substrates W, the multiple number of support substrates S and the multiple number of combined substrates T.

Further, the number of the cassette placing plates 11 is not limited to the aforementioned example. In addition, one of the cassettes may be used to collect a defective substrate. That is, one of the cassettes may be used to separate a combined substrate having a problem in the bonding of the processing target substrate W and the support substrate W for various reasons from other normal combined substrates T.

In the carry-in/out station 2, a first substrate transfer section 20 is provided adjacent to the cassette placing table 10. Provided in the first substrate transfer section 20 is a first substrate transfer device 22 configured to be movable on a transfer path 21 elongated in the Y-axis direction. The first substrate transfer device 22 is also configured to be movable in the vertical direction and pivotable around the vertical axis (θ direction), and is capable of transferring the processing target substrates W, the support substrates S and the combined substrates T between the cassettes Cw, Cs and Ct on the respective cassette placing plates 11 and transition devices 50 and 51 of a third processing block G3 of the processing station 3 to be described later.

The processing station 3 accommodates therein a plurality of, for example, three processing blocks G1, G2 and G3 which are equipped with various processing apparatuses. By way of example, the first processing block G1 is provided at a front side (the negative Y-axis side in FIG. 1) of the processing station 3, and the second processing block G2 is disposed at a rear side (the positive Y-axis side of FIG. 1) of the processing station 3. Further, the third processing block G3 is provided at a side of the carry-in/out station 2 (the negative X-axis side of FIG. 2) of the processing station 3.

By way of example, within the first processing block G1, substrate processing apparatuses 30 to 33 configured to perform a bonding processing and an ultraviolet processing on the processing target substrate W and the support substrate S are arranged in the X-axis direction in this sequence from the carry-in/out station 2 side. Further, the number of the substrate processing apparatuses 30 to 33 and the arrangement thereof may be modified as required. Configurations of the substrate processing apparatuses 30 to 33 will be elaborated later.

For example, within the second processing block G2, coating apparatuses 40 to 43 configured to coat the adhesive G on the processing target substrate W are arranged in the X-axis direction in this sequence from the carry-in/out station 2 side. Further, the number of the coating apparatuses 40 to 43 and the arrangement thereof may be set as required.

Each of the coating apparatuses 40 to 43 may be implemented by a commonly known spin coating device. That is, each of the coating apparatuses 40 to 43 is equipped with a spin chuck configured to hold and rotate the processing target substrate W; and an adhesive nozzle configured to supply the adhesive G onto the processing target substrate W held by the spin chuck.

By way of non-limiting example, within the third processing block G3, the transition devices 50 and 51 for the processing target substrate W, the support substrate S and the combined substrate T are provided in two levels in this sequence from the bottom. Further, the third processing block G3 may be further equipped with a substrate identifying device (not shown) configured to identify the processing target substrate W and the support substrate S by reading identification numbers of the processing target substrate W and the support substrate S before being bonded, or a buffer device (not shown) for the processing target substrate W, the support substrate S and the combined substrate T.

As depicted in FIG. 1, a second substrate transfer section 60 is formed in a region surrounded by the first to third processing blocks G1 to G3. The second substrate transfer section 60 is equipped with, by way of example, a second substrate transfer device 61.

The second substrate transfer device 61 has, for example, a transfer arm configured to be movable in the vertical direction and the horizontal directions (X-axis direction and Y-axis direction) and pivotable around the vertical axis. The second substrate transfer device 61 is moved within the second substrate transfer section 60 while transferring the processing target substrate W, the support substrate S and the combined substrate T into preset apparatuses within the neighboring first processing block G1, second processing block G2 and third processing block G3.

The substrate processing system 1 having the above-described configuration is provided with a control unit 70 as shown in FIG. 1. The control unit 70 is implemented by, by way of example, a computer, and has a program storage unit (not shown). The program storage unit stores a program for controlling the processings of the processing target substrate W, the support substrate S and the combined substrate W in the substrate processing system 1. Further, the program storage unit also stores a program for implementing a bonding processing to be described later in the substrate processing system 1 by controlling operations of the aforementioned various processing apparatuses and the driving system such as the transfer devices. Further, the programs may be recorded in a computer-readable recording medium H, and installed from the recording medium H to the control unit 70. The computer-readable recording medium H may be, by way of example, but not limited to, a hard disc (HD), a flexible disc (FD), a compact disc (CD), a magnet optical disc (MO), or a memory card.

2. Configuration of Substrate Processing Apparatus

Now, configurations of the aforementioned substrate processing apparatuses 30 to 33 will be explained. In the following, a configuration of the substrate processing apparatus 30 will only be described. The other substrate processing apparatuses 31 to 33 have the same configuration as the substrate processing apparatus 30, and, thus, description thereof will be omitted.

Figure 4:
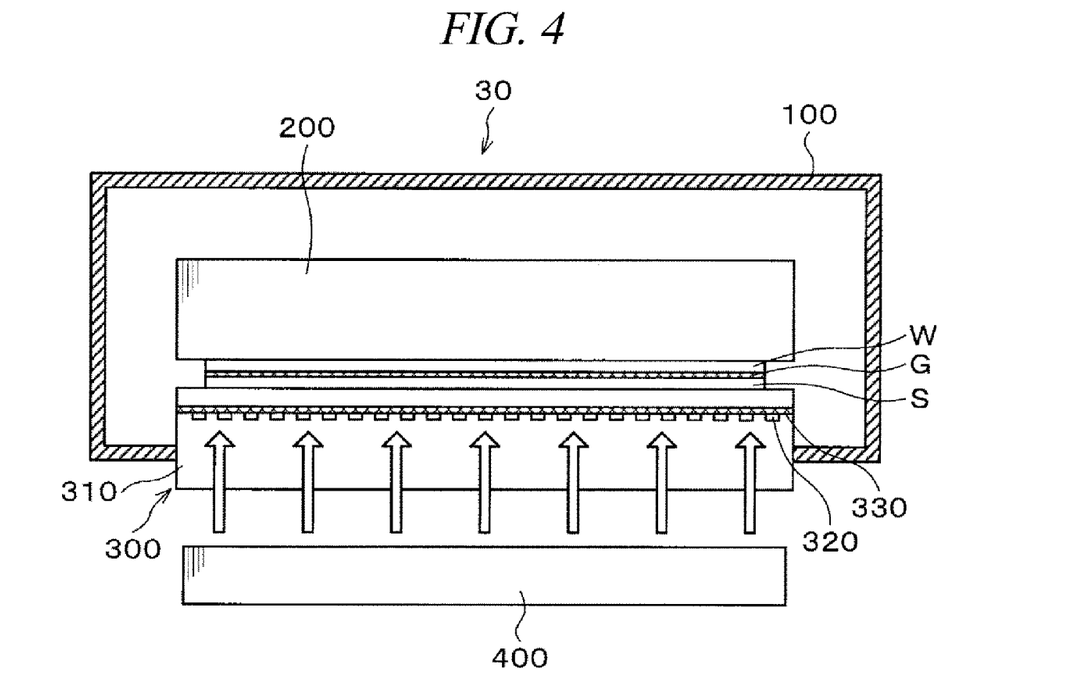
FIG. 4 is a side view illustrating a schematic configuration of the substrate processing apparatus.

As depicted in FIG. 4, the substrate processing apparatus 30 is equipped with a vacuum chamber 100 whose inside can be hermetically sealed. The vacuum chamber 100 is provided with a decompressing device (not shown) equipped with, for example, a vacuum pump, and the inside of the vacuum chamber 100 is maintained in a vacuum atmosphere of a preset vacuum level by the decompressing device. Further, the vacuum chamber 100 may also be equipped with a gas supply device (not shown) configured to supply an inert gas such as a nitrogen gas into the vacuum chamber 100.

A carry-in/out opening (not shown) for the processing target substrate W, the support substrate S and the combined substrate T is formed at a side surface of the vacuum chamber 100 on the side of the second substrate transfer section 60, and an opening/closing shutter (not shown) is provided at the carry-in/out opening. The processing target substrate W, the support substrate S and the combined substrate T are accommodated within the vacuum chamber 100.

The vacuum chamber 100 incorporates a first holding unit 200 configured to hold the processing target substrate W on a bottom surface thereof; and a second holding unit 300 configured to hold the support substrate S on a top surface thereof. The second holding unit 300 is provided under the first holding unit 200 and is disposed to face the first holding unit 200. That is, the processing target substrate W held by the first holding unit 200 and the support substrate S held by the second holding unit 300 are placed to face each other.

The first holding unit 200 is implemented by a commonly known electrostatic chuck. To perform the bonding processing of the processing target substrate W and the support substrate S appropriately, the processing target substrate W and the support substrate S need to be held at preset positions. For the purpose, the electrostatic chuck capable of holding the processing target substrate W appropriately even in the vacuum atmosphere is used as the first holding unit 200.

Further, the first holding unit 200 is configured to be movable up and down in the vertical direction by an elevating mechanism (not shown). Moreover, the vacuum chamber 100 may be divided into an upper chamber and a lower chamber, and the upper chamber may be configured to be movable up and down in the vertical direction and the first holding unit 200 may be configured to be movable up and down along with the upper chamber.

The second holding unit 300 is implemented by an electrostatic chuck. The reason why the electrostatic chuck is used as the second holding unit 300 is the same as the above-stated reason why the electrostatic chuck is used as the first holding unit 200. A configuration of the second holding unit 300 will be elaborated later.

A lower portion (bottom surface) of the second holding unit 300 is exposed from the vacuum chamber 100. As will be described later, an ultraviolet irradiation unit 400 is provided under the second holding unit 300, and an ultraviolet ray irradiated from the ultraviolet irradiation unit 400 is transmitted through the second holding unit 300. If the second holding unit 300 is provided inside the vacuum chamber 100 completely, a part of a bottom surface of the vacuum chamber 100 needs to be made of a material through which an ultraviolet ray can be transmitted. In the present exemplary embodiment, however, since the second holding unit 300 is exposed from the vacuum chamber 100, the bottom surface of the vacuum chamber 100 need not be made of the ultraviolet transmissive material. Therefore, an apparatus configuration can be simplified, so that an apparatus cost can be reduced.

The ultraviolet irradiation unit 400 configured to irradiate the ultraviolet ray to the adhesive G is provided at an outside of the vacuum chamber 100. Though not particularly limited, a wavelength of the ultraviolet ray irradiated from the ultraviolet irradiation unit 400 may be, by way of example, 365 nm.

A commonly known ultraviolet irradiation device is used as the ultraviolet irradiation unit 400. That is, the ultraviolet irradiation unit 400 may have a configuration in which, for example, a multiple number of LEDs (light emitting diodes) is disposed on a board. In this case, since a heat generation amount is large and an outgas is generated when the LEDs irradiate ultraviolet rays, the ultraviolet irradiation unit 400 is disposed at the outside of the vacuum chamber 100.

Furthermore, besides the above-described components, the substrate processing apparatus 30 is further provided with a position adjusting unit (not shown) configured to adjust a horizontal direction of the processing target substrate W or the support substrate S before the bonding thereof, an inverting mechanism (not shown) configured to invert the processing target substrate W or the support substrate S before the bonding thereof, and so forth.

Besides, operations of the individual components of the substrate processing apparatuses 30 to 33 are controlled by the above-described control unit 70.

3. Configuration of Second Holding Unit and Manufacturing Method Thereof

Figure 5:
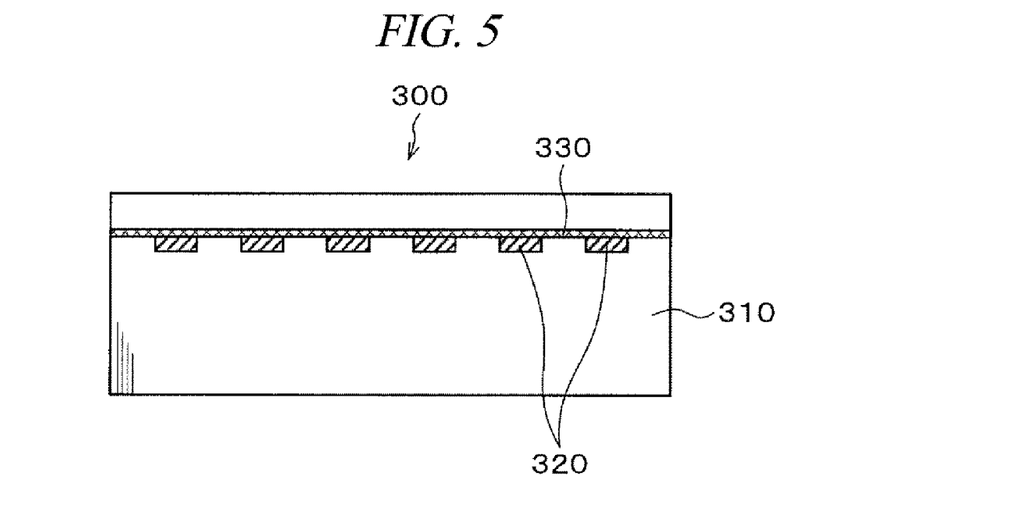
FIG. 5 is an explanatory diagram showing an enlarged view of a part of a second holding unit.

Now, a configuration of the second holding unit 300 and a manufacturing method thereof will be discussed. FIG. 5 is a diagram depicting an enlarged view of a part of the second holding unit 300.

As illustrated in FIG. 5, the second holding unit 300 has a flat plate-shaped base body 310. The base body 310 is implemented by, for example, a quartz glass or the like. However, any other type of transparent body may be used as the base body 310 as long as it is made of a material through which the ultraviolet can be transmitted.

Electrodes 320 configured to electrostatically attract the support substrate S are provided within the base body 310. The electrodes 320 are made of, by way of non-limiting example, ITO (Indium-Tin Oxide). The electrodes 320, however, may be implemented by any of various other types of transparent electrodes as long as the electrodes 320 are made of a material through which the ultraviolet can be transmitted.

When viewed from the side, the electrodes 320 are arranged at a preset distance of, e.g., 0.2 µm therebetween. Further, when viewed from the top, the electrodes 320 are arranged in a comb-teeth shape. Here, a so-called gradient type electrostatic chuck is used as the second holding unit 300 to electrostatically attract the support substrate S as an insulator. In such a configuration, in the second holding unit 300, the support substrate S is charged with electricity through electrostatic induction or dielectric polarization with respect to electric charges applied to the electrodes 320 to be attracted thereto. As mentioned above, by reducing the size of the electrodes 320 and narrowing the distance therebetween, a large non-uniform electric field is generated, so that the support substrate S as the insulator can be attracted by a gradient force.

Within the base body 310, a diffusion layer 330 is provided above the electrodes 320 to diffuse a transmission direction of the ultraviolet ray. The diffusion layer 330 has irregularities, and is capable of diffusing the ultraviolet ray by diffusely reflecting the ultraviolet ray with the irregularities. Further, when viewed from the top, the diffusion layer 330 is formed on the entire surface of the base body 310.

Figure 6A:
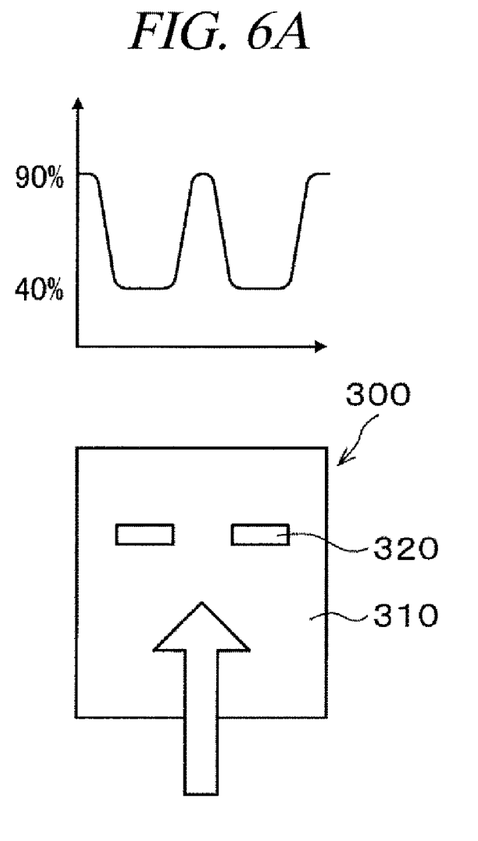
FIG. 6A shows a distribution of the transmittance of the ultraviolet ray when a diffusion layer is not provided and FIG. 6B shows a distribution of the transmittance of the ultraviolet ray when the diffusion layer is provided.
Figure 6B:
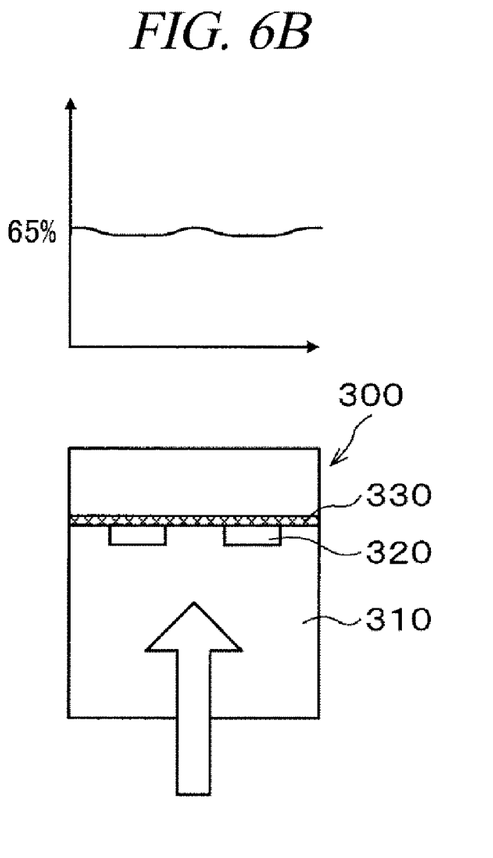

Here, an operation effect of the diffusion layer 330 will be explained. FIG. 6A and FIG. 6B show distributions of transmittance of the ultraviolet ray transmitted through the second holding unit 300. FIG. 6A shows a distribution of the transmittance of the ultraviolet ray when the diffusion layer 330 is not provided, and FIG. 6B shows a distribution of the transmittance of the ultraviolet ray when the diffusion layer 330 is provided.

Referring to FIG. 6A, the ultraviolet ray transmittance is low as 40% at portions where the electrodes 320 are provided, whereas the ultraviolet ray transmittance is high as 90% at portions where the electrodes 320 are not provided. It is because the electrodes 320 easily absorb the ultraviolet ray and it may be difficult for the electrodes 320 to transmit the ultraviolet ray as compared to the base body 310. That is, the ultraviolet ray transmittances of the electrodes 320 and the base body 310 are different. Accordingly, in case that the diffusion layer 330 is not formed, the distribution of the transmittance of the ultraviolet ray (distribution in the horizontal direction) becomes non-uniform, so that non-uniformity in projection of the ultraviolet ray irradiated to the adhesive G, which is caused by the pattern of the electrodes 320, is generated. Therefore, the ultraviolet processing upon the adhesive G cannot be performed uniformly. Further, in the ultraviolet processing, if the intensity of the ultraviolet irradiation to the adhesive G is non-uniform, there is generated a time difference in the curing of the adhesive G, so that curing non-uniformity may occur. If the curing non-uniformity occurs, a bonding state (bonding strength or thickness) of the combined substrate T may become non-uniform.

Meanwhile, referring to FIG. 6B, the transmittance of the ultraviolet ray transmitted through the diffusion layer 330 becomes uniform in the horizontal direction. It is because the ultraviolet ray transmitted through the base body 310 or the electrodes 320 is diffused by the diffusion layer 330 to be uniformly distributed in the horizontal direction. Accordingly, in case that the diffusion layer 330 is formed, the distribution of the transmittance of the ultraviolet ray can be made uniform regardless of presence or absence of the electrodes 320, so that the ultraviolet processing upon the adhesive G can be performed uniformly.

Now, a manufacturing method of the second holding unit 300 having the above-described configuration will be explained. FIG. 7A to FIG. 7D are diagrams illustrating major processes in the manufacturing method of the second holding unit 300.

Figure 7A:
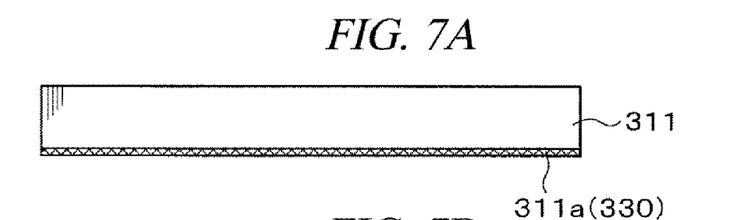
FIG. 7A to FIG. 7D are explanatory diagrams illustrating major processes in a manufacturing method of the second holding unit.

First, as shown in FIG. 7A, irregularities are formed on a surface 311a of a first base body 311 having a flat plate shape. The irregularities are formed on the entire region of the surface 311a by, for example, sand blast. The surface 311a having the irregularities formed thereon serves as the diffusion layer 330. Further, the method of forming the irregularities on the surface 311a is not limited to the present exemplary embodiment. By way of example, a resin-based sheet having irregularities may be attached to the surface 311a.

Figure 7B:
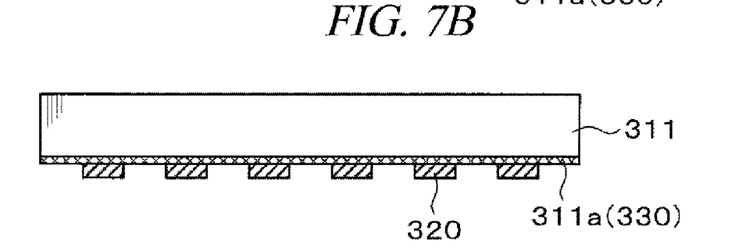

Then, as depicted in FIG. 7B, the electrodes 320 are provided on the surface 311a of the first base body 311. The electrodes 320 are formed to have a preset pattern (line and space) by, for example, Gravure Printing. The method of forming the electrodes 320 is not limited to the present exemplary embodiment. By way of non-limiting example, the electrodes 320 may be provided on the surface 311a by performing a photolithography processing.

Figure 7C:
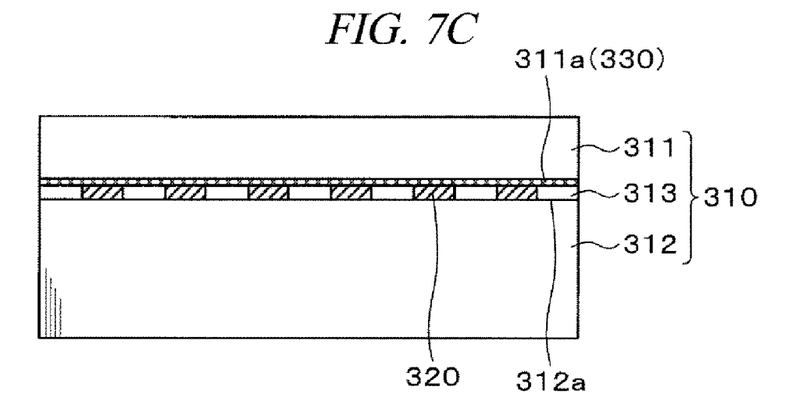

Thereafter, as illustrated in FIG. 7C, the first base body 311 and a second base body 312 are placed such that the surface 311a of the first base body 311 and a surface 312a of the second base body 312 having a flat plate shape face each other. Then, a filling material 313 is filled between the surface 311a of the first base body 311 and the surface 312a of the second base body 312, and the first base body 311 and the second base body 312 are bonded to each other. As the filling material 313, an organic-based adhesive is used, for example.

Figure 7D:
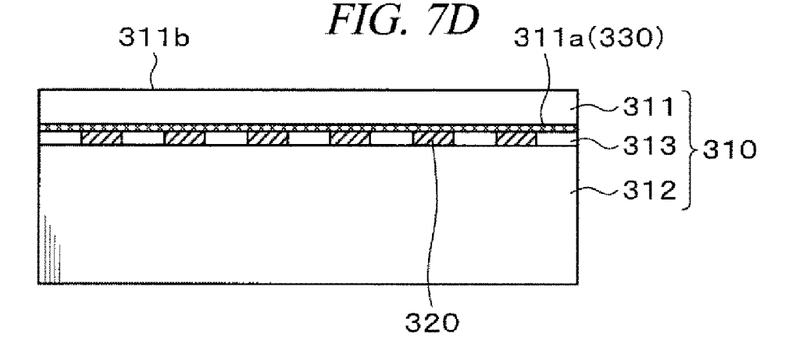

Subsequently, as depicted in FIG. 7D, by cutting and polishing a rear surface 311b of the first base body 311, the first base body 311 is thinned. The first base body 311, the second base body 312 and the filling material 313 form the base body 310. In this way, the second holing unit 300 is manufactured.

4. Operation of Substrate Processing System

Now, a substrate processing method upon the processing target substrate W and the support substrate S performed by using the substrate processing system 1 having the above-described configuration will be explained.

First, the cassette Cw accommodating the multiple number of processing target substrates W, the cassette Cs accommodating the multiple number of support substrates W and the empty cassette Ct are placed on the preset cassette placing plates 11 of the carry-in/out station 2. Then, the support substrate S within the cassette Cs is taken out by the first substrate transfer device 22, and transferred into the transition device 50 of the third processing block G3 of the processing station 3. At this time, the support substrate S is transferred with the bonding surface Sj thereof facing upwards.

Then, the support substrate S is transferred into the coating apparatus 40 by the second substrate transfer device 61. The support substrate S carried into the coating apparatus 40 is delivered onto the spin chuck from the second substrate transfer device 61 to be attracted to and held by the spin chuck. At this time, the non-bonding surface Sn of the support substrate S is attracted to and held by the spin chuck. Then, while rotating the support substrate S by the spin chuck, the adhesive G is supplied to the bonding surface Sj of the support substrate S from the adhesive nozzle. The supplied adhesive G is diffused onto the entire bonding surface Sj of the support substrate S by the centrifugal force, so that the adhesive G is coated on the bonding surface Sj of the support substrate S.

Next, the support substrate S is transferred into the substrate processing apparatus 30 by the second substrate transfer device 61. In the substrate processing apparatus 30, a position of a notch of the support substrate S is adjusted by the position adjusting unit, so that the horizontal direction of the support substrate S is adjusted. Then, the support substrate S is held by the second holding unit 300. Specifically, the support substrate S is held by the second holding unit 300 with the bonding surface Sj of the support substrate S facing upwards, that is, with the adhesive G facing upwards.

While the aforementioned processing is being performed on the support substrate S, a processing on the processing target substrate W is also performed following the support substrate S. The processing target substrate W is transferred into the substrate processing apparatus 30 by the second substrate transfer device 61. At this time, the processing target substrate W is transferred with the bonding surface Wj facing upwards.

In the substrate processing apparatus 30, after the horizontal direction of the corresponding processing target substrate W is adjusted by adjusting a position of a notch of the processing target substrate W through the position adjusting unit, a front surface and a rear surface of the processing target substrate W are inverted by the inverting mechanism. Then, the processing target substrate W is held by the first holding unit 200. Specifically, the processing target substrate W is held with the bonding surface Wj thereof facing downwards.

Thereafter, in the substrate processing apparatus 30, the relative positions in the horizontal direction of the processing target substrate W held by the first holding unit 200 and the support substrate S held by the second holding unit 300 are adjusted, and the vacuum chamber 100 is hermetically sealed. Then, an atmosphere within the vacuum chamber 100 is sucked in by the decompressing device, so that the inside of the vacuum chamber 100 is decompressed to a preset vacuum level, for example, equal to or less than 100 Pa. Even when the inside of the vacuum chamber 100 is maintained in this vacuum atmosphere, the first holding unit 200 is still capable of holding the processing target substrate W by electrostatically attracting the processing target substrate W, and the second holding unit 300 is also still capable of holding the support substrate S by electrostatically attracting the support substrate S.

In this vacuum atmosphere, by lowering the first holding unit 200, the processing target substrate W and the support substrate S are bonded to each other by being pressed against each other. At this time, since the inside of the vacuum chamber 100 is maintained in the vacuum atmosphere, void generation between the processing target substrate W and the support substrate S can be suppressed even if the processing target substrate W and the support substrate S are brought into contact with each other.

Further, in this bonding processing, if the processing target substrate W is brought into contact with the adhesive G on the support substrate S by lowering the first holding unit 200, the ultraviolet ray having the wavelength of, e.g., 365 nm is irradiated from the ultraviolet irradiation unit 400 toward the adhesive G. The ultraviolet ray is irradiated to the adhesive G after transmitted through the second holding unit 300 and the support substrate S, so that the adhesive G is cured. Accordingly, the adhesivity of the adhesive G is improved. That is, through the pressing of the processing target substrate W by the first holding unit 200 and the ultraviolet curing of the adhesive G, the processing target substrate W and the support substrate S are bonded.

In the ultraviolet processing, when the ultraviolet ray is transmitted through the second holding unit 300, the distribution of the ultraviolet ray can be uniformed by the diffusion layer 330 as stated above. Accordingly, the ultraviolet processing upon the adhesive G can be performed uniformly.

Subsequently, the combined substrate T, which is obtained as the processing target substrate W and the support substrate S are bonded, is transferred into the transition device 51 by the second substrate transfer device 61, and then transferred into the cassette Ct on the preset cassette placing plate 11 by the first substrate transfer device 22 of the carry-in/out station 2. Through these processes, the series of substrate processings of the processing target substrate W and the support substrate S is ended.

According to the above-described exemplary embodiment, the bonding processing and the ultraviolet processing can be performed on the processing target substrate W and the support substrate S in the single substrate processing apparatus 30. Therefore, the throughput of the series of substrate processings can be improved.

Furthermore, since the diffusion layer 330 is formed within the second holding unit 300, the transmission direction of the ultraviolet ray transmitted through the second holding unit 300 can be diffused. For this reason, the distribution of the ultraviolet ray can be uniformed regardless of presence or absence of the electrodes 320, so that the ultraviolet processing upon the adhesive G can be performed uniformly.

5. Other Exemplary Embodiments

Now, other exemplary embodiments will be discussed.

Figure 8:
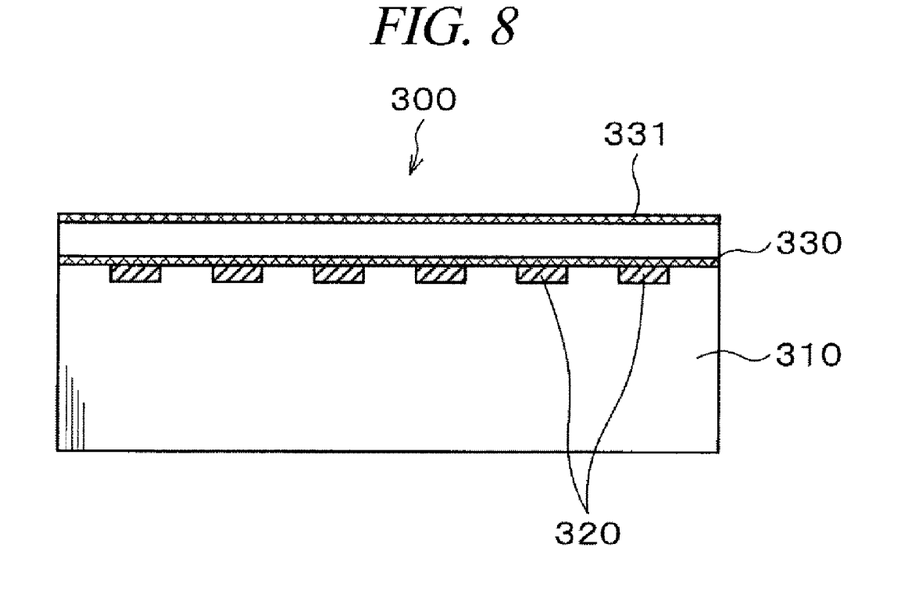
FIG. 8 is an explanatory diagram illustrating an enlarged view of a part of a second holding unit according to another exemplary embodiment.

Though the diffusion layer 330 is formed in a single layer in the second holding unit 300 according to the above-described exemplary embodiment, the diffusion layer 330 may be formed in two layers. As depicted in FIG. 8, a diffusion layer 331 is further formed on a rear surface of the base body 310 at a position higher than the diffusion layer 330.

When manufacturing the second holding unit 300 having this diffusion layer 331, the irregularities are formed on the rear surface of the base body 310 (the rear surface 311b of the first base body 311) in the second holding unit 300 shown in FIG. 5. That is, after the above-described processes of FIG. 7A to FIG. 7D are performed, the irregularities are formed on the rear surface 311b of the first base body 311 by performing sand blast. Then, the diffusion layer 331 is formed. Here, the method of forming the irregularities on the rear surface 311b is not limited to the present exemplary embodiment. By way of example, a resin-based sheet having irregularities may be attached to the rear surface 311b.

With this configuration, when the ultraviolet ray irradiated from the ultraviolet irradiation unit 400 transmits the inside of the second holding unit 300 in the ultraviolet processing, the ultraviolet ray is diffused by the diffusion layers 330 and 331. Accordingly, the distribution of the ultraviolet ray can be further uniformed, so that the ultraviolet processing upon the adhesive G can be performed more uniformly.

Further, the diffusion layers 330 and 331 in the second holding unit 330 may be formed in more than two layers.

Figure 9:
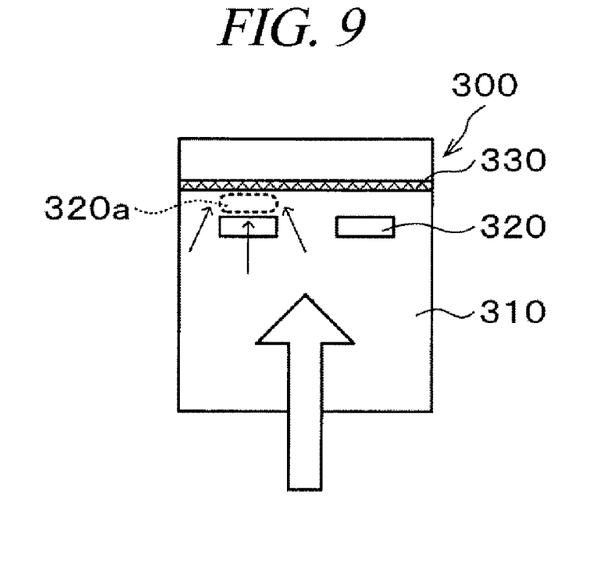
FIG. 9 is an explanatory diagram illustrating an enlarged view of a part of a second holding unit according to still another exemplary embodiment.

In the second holding unit 300 according to the above-described exemplary embodiments, the diffusion layer 330 is provided adjacent to the electrodes 320. As shown in FIG. 9, however, the diffusion layer 330 may be provided while being spaced apart from the electrodes 320. In this case, in addition to the ultraviolet ray having transmitted the electrodes 320 (straight line arrow of FIG. 9), the ultraviolet ray (an oblique line arrow of FIG. 9) having transmitted through gaps between the electrodes 320 may enter a space 320a between the electrodes 320 and the diffusion layer 330. As the diffusion layer 330 is provided spaced apart from the electrodes 320, the transmittance of the ultraviolet ray before transmitting the diffusion layer 330 can be uniformed in the horizontal direction. As a result, the transmittance of the ultraviolet ray transmitted through the diffusion layer 330 can be increased, so that the distribution of the ultraviolet ray in the horizontal direction can be further uniformed.

In the substrate processing apparatus 30 according to the above-described exemplary embodiments, the first holding unit 200 configured to hold the processing target substrate W is disposed at an upper position, while the second holding unit 300 configured to hold the support substrate S is disposed at a lower position. However, the vertical arrangement of the first holding unit 200 and the second holding unit 300 can be inverted. In such a case, the ultraviolet irradiation unit 400 may be disposed above the second holding unit 300. By performing the processings upon the processing target substrate W and the support substrate S in the reverse way as in the above-described exemplary embodiments, the series of substrate processings can be implemented.

In the above-described exemplary embodiments, the adhesive G is coated on the bonding surface Sj of the support substrate S. However, the adhesive G may be coated on the bonding surface Wj of the processing target substrate W, or on both of the bonding surface Wj of the processing target substrate W and the bonding surface Sj of the support substrate S.

Furthermore, though the exemplary embodiments have been described for the case of using the adhesive G as the ultraviolet curing material, the exemplary embodiments are also applicable to an ultraviolet curing material used for other purposes. By way of example, in a so-called imprint processing of forming a preset resist pattern on a substrate by using a templet (mold), a resist coated on the substrate may be an ultraviolet curing material. In such a case, the exemplary embodiments of the present disclosure can be applied.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus configured to perform a preset processing on a processing target substrate and a support substrate, the substrate processing apparatus comprising:
   a first holding unit configured to hold the processing target substrate;
   a second holding unit disposed to face the first holding unit and configured to hold the support substrate by electrostatically attracting the support substrate; and
   an ultraviolet irradiation unit configured to irradiate an ultraviolet ray to an ultraviolet curing material provided between the processing target substrate held by the first holding unit and the support substrate held by the second holding unit,
   wherein each of the support substrate and the second holding unit is made of a material through which the ultraviolet ray is transmitted,
   an electrode configured to electrostatically attract the support substrate is provided within the second holding unit, and
   a diffusion layer configured to diffuse a transmission direction of the ultraviolet ray is provided at a position closer to the support substrate between the support substrate and the electrode within the second holding unit.

2. The substrate processing apparatus of claim 1, wherein the diffusion layer is formed in multiple layers at the position closer to the support substrate between the support substrate and the electrode.

3. The substrate processing apparatus of claim 1, further comprising:
   a vacuum chamber configured to accommodate therein the processing target substrate and the support substrate.

4. The substrate processing apparatus of claim 3, wherein the ultraviolet irradiation unit is provided at an outside of the vacuum chamber.

5. The substrate processing apparatus of claim 3, wherein the second holding unit is disposed such that a holding surface of the second holding unit, which holds the support substrate, is located within the vacuum chamber and a surface thereof opposite to the holding surface is exposed from the vacuum chamber.

* * * * *